(12) United States Patent
VanWyk

(10) Patent No.: US 11,016,146 B2
(45) Date of Patent: May 25, 2021

(54) EQUIVALENT TIME NETWORK ANALYZER

(71) Applicant: Massachusetts Institute of Technology, Cambridge, MA (US)

(72) Inventor: Eric Judson VanWyk, Somerville, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/885,741

(22) Filed: Jan. 31, 2018

(65) Prior Publication Data

US 2018/0284191 A1     Oct. 4, 2018

Related U.S. Application Data

(60) Provisional application No. 62/452,847, filed on Jan. 31, 2017.

(51) Int. Cl.
*G01R 31/3183* (2006.01)
*G01R 31/317* (2006.01)
*G01R 31/319* (2006.01)

(52) U.S. Cl.
CPC ........... *G01R 31/318378* (2013.01); *G01R 31/31703* (2013.01); *G01R 31/31922* (2013.01)

(58) Field of Classification Search
CPC .. H04L 43/50; H04W 16/14; G01R 31/31703; G01R 31/318378; G01R 31/31922; G06F 1/14; H04J 3/0661
See application file for complete search history.

(56) References Cited

U.S. PATENT DOCUMENTS

| 6,335,931 | B1 * | 1/2002 | Strong | G06F 1/14 370/390 |
| 9,769,041 | B2 * | 9/2017 | Johannes | H04L 12/437 |
| 10,320,499 | B2 * | 6/2019 | Lomnitz | H04B 17/309 |

\* cited by examiner

*Primary Examiner* — Elias Desta
(74) *Attorney, Agent, or Firm* — Norma E. Henderson

(57) ABSTRACT

An equivalent time network analyzer and method estimates a device-under-test's frequency response by acquiring its time domain response through equivalent time over-sampling. The analyzer has a timing system producing two time bases differing in period by less than one part per million, resulting in a linearly varying phase difference. A high frequency stimulus generator, synchronized to the first time basis, creates a periodic waveform that contains energy at harmonics of the first time basis. An output capture cell that captures the response of the device-under-test includes a high bandwidth input comparator, a memory element clocked to the second time basis, and a low bandwidth feedback filter that provides a low frequency analog estimate of the time domain response of the device-under-test as feedback to the input comparator and as output from the capture cell. The analyzer may also include input capture cells, multiple stimulus generators, and/or multiple output capture cells.

18 Claims, 9 Drawing Sheets

EQUIVALENT TIME NETWORK ANALYZER

RELATED APPLICATIONS

This application claims the benefit of U.S. Provisional Application Ser. No. 62/452,847, filed Jan. 31, 2017, the entire disclosure of which is herein incorporated by reference.

STATEMENT REGARDING FEDERALLY SPONSORED RESEARCH OR DEVELOPMENT

This invention was made with U.S. Government Support under Grant Number HR0011-16-2-0003, awarded by the Defense Advanced Projects Research Agency. The U.S. Government has certain rights in this invention.

FIELD OF THE TECHNOLOGY

The present invention relates to electrical network analyzers and, in particular, to an analog front end for a network analyzer.

BACKGROUND

Equivalent-time sampling oscilloscopes are used to measure repetitive electrical waveforms with bandwidths that exceed the Nyquist limitation of their sample rate. For example, the Tektronix DSA8300 Digital Sampling Oscilloscope can sample a 70 GHz signal at 300,000 samples per second.

Network analyzers measure the frequency domain response of a device-under-test. Frequency-domain network analyzers typically measure a single frequency at a time by stimulating with a clean sinewave and measuring the result, sweeping through the range of interest.

SUMMARY

A network analyzer employing equivalent time over-sampling according to the invention generates a reproduction of a device-under-test's electrical response to a provided stimulus slowed by a time dilation factor that is capable of exceeding one billion to one. While network analyzers measure the frequency domain response of a device-under-test, a system according to the invention measures the time domain response of the device-under-test. These two measurements are mathematically equivalent via the Fourier transform. While frequency-domain network analyzers typically measure a single frequency at a time, a system according to the invention provides the ability to simultaneously measure harmonics of the stimulus frequency.

In one aspect of the invention, an equivalent time network analyzer includes a timing system configured to produce a first time basis and a second time basis that differ in period by less than one part per million, resulting in a linearly varying phase difference between the first time basis and the second time basis; at least one high frequency stimulus generator configured to receive timing input according to the first time basis and create a periodic waveform that is synchronized to the first time basis and that contains energy at the harmonics of the first time basis that are of interest for measurement, the stimulus generator being connected to an input of a device-under-test so as to be able to stimulate the device-under-test; and at least one output capture cell connected to an output of the device-under-test so as to be able to capture a response of the device-under-test to a stimulus from the stimulus generator. Each capture cell includes a high bandwidth input comparator, a clocked memory element configured to hold a result received from the high bandwidth input comparator according to the second time basis, and a low bandwidth feedback filter that provides a low frequency analog estimate of a time domain response of the device-under-test as feedback to the input comparator and as an output from the output capture cell. The timing system may include a first clock that produces the first time base and a second clock that produces the second time base, with the output of the first clock being connected to the stimulus generator and the output of the second clock being connected to the clocked memory element.

The equivalent time network analyzer may include at least one input capture cell, the input capture cell being attached to the input of the device-under-test and sharing the first time basis with the output capture cells. There may be multiple stimulus generators that share the first time basis. There may be multiple capture cells that share the second time basis. The equivalent time network analyzer may include at least one analog-to-digital converter connected at the output of one of the capture cells. There may be at least one microcontroller at the output of at least one of the analog-to-digital converters. The equivalent time network analyzer may be configured to simultaneously test a plurality of devices-in-test.

In another aspect of the invention, a method for obtaining the frequency response of a device-under-test using equivalent time over-sampling includes: producing a first time basis and a second time basis that differ in period by less than one part per million, resulting in a linearly varying phase difference between the first time basis and the second time basis, such that the difference in period is the effective equivalent sampling period of the system and the ratio of the equivalent sampling rate to the true sampling rate is the time dilation factor of the system; creating a periodic waveform that is synchronized to the first time basis and contains energy at the harmonics of the first time basis that are of interest for measurement; stimulating the device-under-test with the periodic waveform; capturing the electrical response of the device-under-test to stimulation by the periodic waveform with at least one capture cell comprising a high bandwidth comparator and a clocked memory element synchronized to the second time basis; converting the comparator's high frequency single bit signal to a lower frequency analog signal that is a low frequency analog estimate of a time domain response of the device-under-test; feeding the low frequency analog signal back to the comparator as a negative feedback loop; and outputting the low frequency analog signal as the analog estimate of the time domain response of the device-under-test.

The method may include the step of converting the analog estimate of the time domain response of the device-under-test to a frequency domain response. The method may include the step of performing further analysis on the analog estimate of the time domain response of the device-under-test. The method may include the step of digitizing the low frequency analog signal. The method may include the step of performing further analysis on the digitized low frequency analog signal. The method may include the step of breaking the feedback loop for increased temporal resolution of digital events. The method may include the step of capturing the input to the device-under-test with at least one input capture cell.

BRIEF DESCRIPTION OF THE DRAWINGS

Other aspects, advantages and novel features of the invention will become more apparent from the following detailed description of the invention when considered in conjunction with the accompanying drawings, wherein:

FIGS. 3-6 depict a hierarchical schematic of an example implementation of the invention, wherein FIG. 3 depicts an example comparator cell, FIG. 4 depicts an example stimulus generator, FIG. 5 depicts an example termination supply, and FIG. 6 depicts an example top layer view.

DETAILED DESCRIPTION

The present invention is an analog front end for a network analyzer that acquires a device-under-test's frequency response via equivalent time over-sampling. In the present invention, horizontal (time or frequency) and vertical (voltage or dB) resolutions are both derived from the equivalent time sampling mechanism. In contrast, traditional equivalent time sampling systems derive only horizontal resolution in this manner.

In a preferred embodiment, four main subsystems are connected with the device-under-test: a timing system with two clock outputs, a stimulus generator connected to the first clock output and the device-under-test, a clocked comparator connected to the second clock output, and an estimator to output the time-stretched response.

Figure 1:
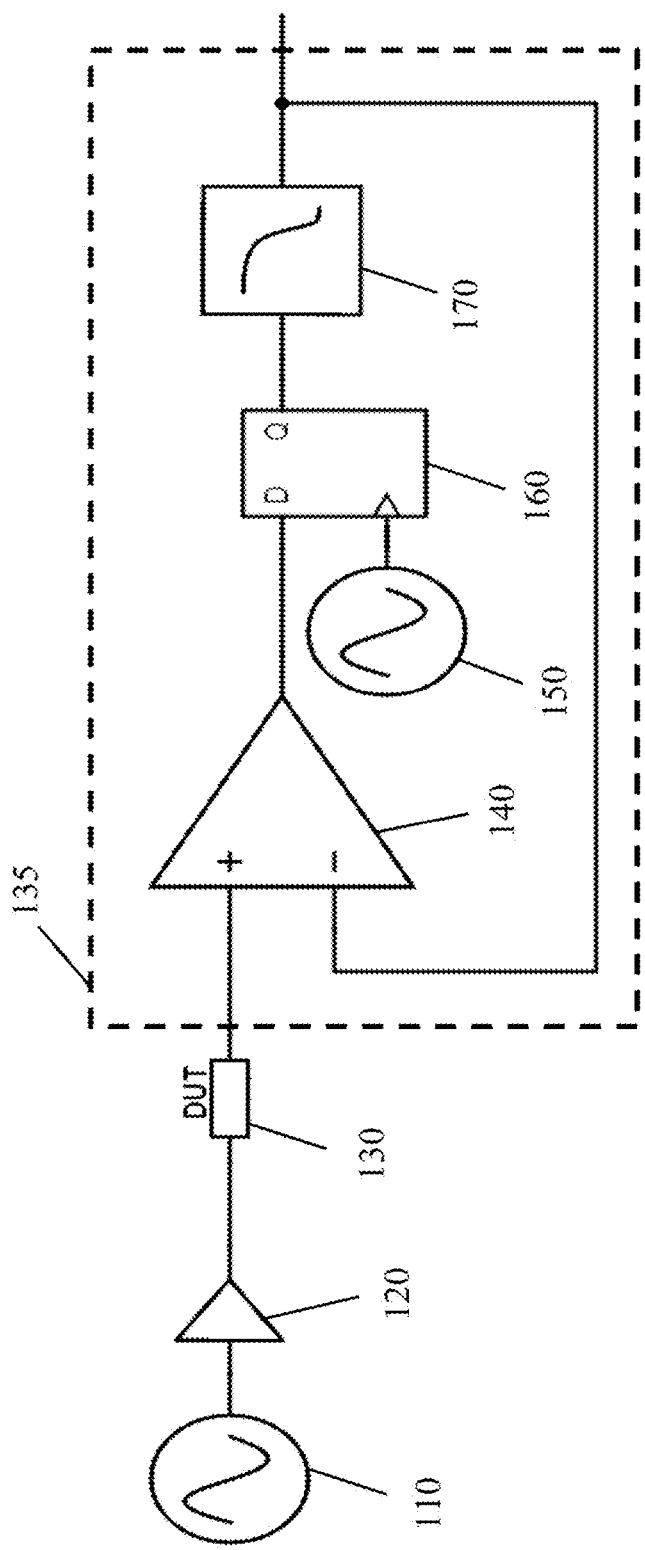
FIG. 1 is a simplified block diagram of a preferred embodiment of the invention.

FIG. 1 is a simplified block diagram of a basic example embodiment of the invention. Shown in FIG. 1 are stimulus clock 110, stimulus generator 120, device-under-test 130, and capture cell 135, comprising high speed (high bandwidth input) comparator 140, a clocked memory element comprising sample clock 150 and high speed latch/D flip-flop 160, and low pass (low bandwidth) filter 170. Suitable devices for these elements are well-known in the art. In the example implementation prototype designs, devices used include, but are not limited to, for stimulus clock 110, Analog Devices AD9578; for stimulus generator 120, Analog Devices ADCMP572; for high speed comparator 140, Analog Devices ADCMP573; for sample clock 150, Analog Devices AD9578; for high speed latch/D flip-flop 160, On Semiconductor MC100EP52DTG; and for low pass filter 170, a generic resistor-capacitor filter.

The timing subsystem produces two nearly identical clock outputs: a stimulus clock and a sample clock. The periods of these two clocks differ by a very small amount (less than one part in one million). This produces a linearly varying difference in phase between the two clocks. The difference in periods becomes the effective equivalent sampling period of the system. The ratio of the equivalent sampling rate to the true sampling rate becomes the time dilation factor of the system. Algebraically, this can be represented as:

$$T_{EQUIVALENT} = |T_{SAMPLE} - T_{STIMULUS}|$$

$$\text{Dilation Factor} = T_{EQUIVALENT}/T_{SAMPLE}$$

The stimulus generator creates a periodic waveform that is synchronized to the stimulus clock, and contains energy at the harmonics of the stimulus clock that are of interest for measurement. In its simplest form, a high speed digital output stage can generate a band-limited square wave. Alternatively, a step recovery diode can be used to generate a pulsatile stimulus waveform. Linear elements, such as a bandpass filter, can be added to concentrate energy in specific frequencies of interest. Non-linear elements, such as an RF shockline, can be used to move energy to higher frequencies of interest.

The estimator (feedback filter) converts the sampling comparator's high frequency single bit signal to a lower frequency analog signal. This low frequency analog estimate is fed back to the sampling comparator with negative feedback. The output of the estimator is provided as the output of the system, and can be digitized and/or analyzed by traditional low frequency means known in the art.

Equivalent Time Oscilloscopes (ETOs) operate in a manner similar to the sampling portion of the invention, in that they are capable of reconstructing a fast repetitive waveform by taking samples from multiple iterations for a single reconstruction. Their approach in doing so differs in two major ways: the use of a track-and-hold amplifier and the time base generation. An ETO's track-and-hold amplifier achieves the same effect as the loop created by the capture cell (components 140, 150, 160 and 170 in FIG. 1). A track-and-hold amplifier can take a single complete sample during each sample period, whereas the present invention requires multiple periods to complete a sample. However, the present invention can achieve a higher input bandwidth for a given process technology. Additionally, a track-and-hold requires a high speed analog-to-digital converter and associated high speed digital processing. The present invention can achieve extremely high time dilation factors, which allows it to use low cost converters and processors. The clocking approach of the invention directly controls the timing of signal and its sampling, whereas ETOs are inherently asynchronous to the signal they are measuring and must reconstruct that synchronization. The current invention limits the types of sources of signals it can measure, but has a much faster equivalent sample rate.

Figure 2:
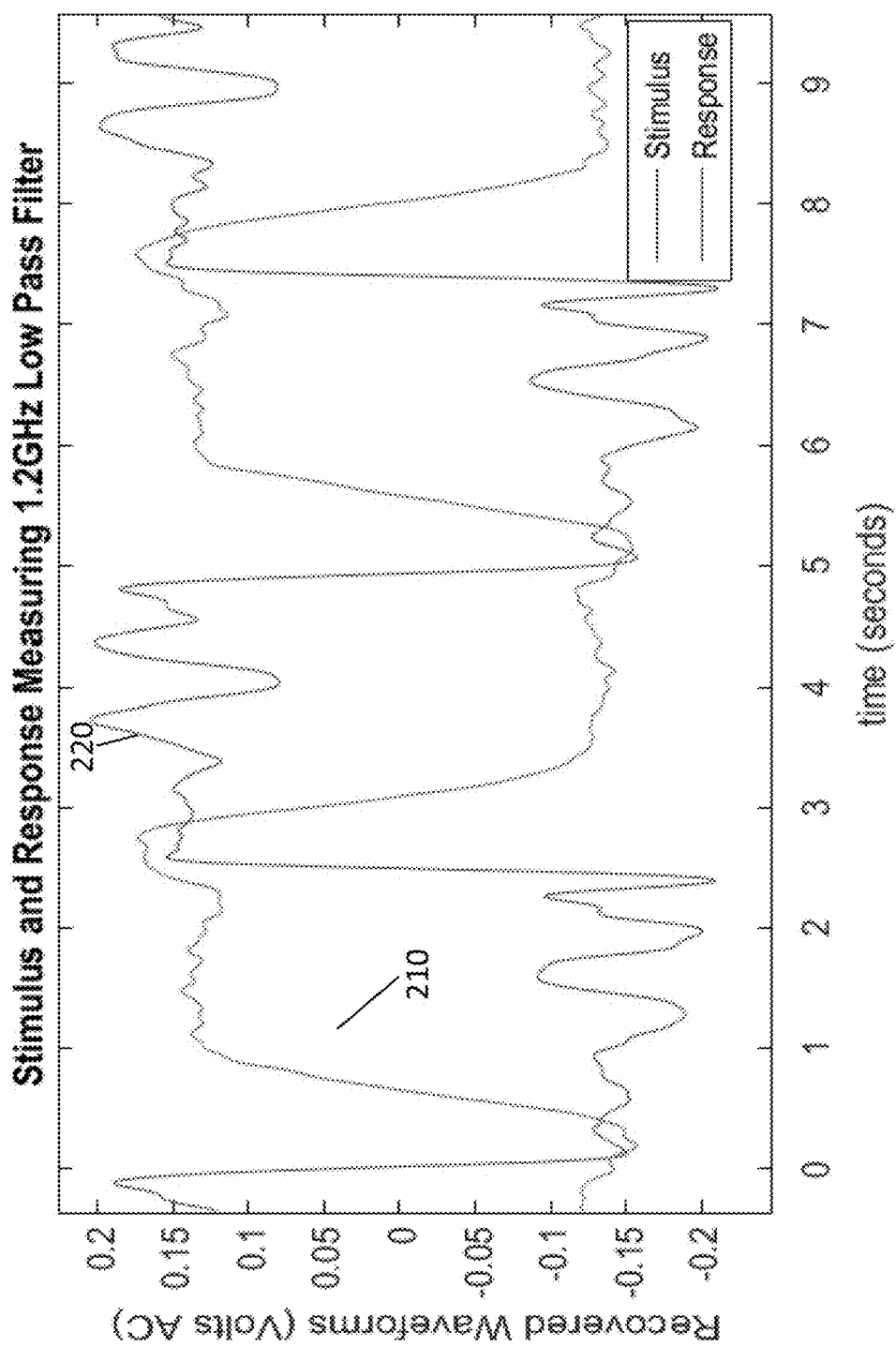
FIG. 2 depicts example results when a 1.2 GHz low pass filter is used as the device-under-test in an example implementation of the invention.

For the purposes of illustration, in one example implementation, the sample clock is set to 100 MHz and the stimulus clock is set to (100 MHz+0.01 Hz). This produces a 100 megasample per second true sample rate, a 1 exasample per second equivalent time sample rate, an equivalent time per-sample delay of 1 attosecond, and a time dilation factor of one part in one billion. Less severe time dilation factors can be achieved by increasing the difference between the stimulus and sample clocks. An RF Low Pass Filter with a corner frequency of 1.2 GHz is used as an example device-under-test. Its real time response should therefore contain energy at frequencies up to 1.2 GHz, and the system response should have frequency content up to 1.2 Hz. This is shown in FIG. 2, which depicts example output stimulus 210 and response 220 waveforms when a 1.2 GHz low pass filter is used as the device-under-test.

Figure 3:
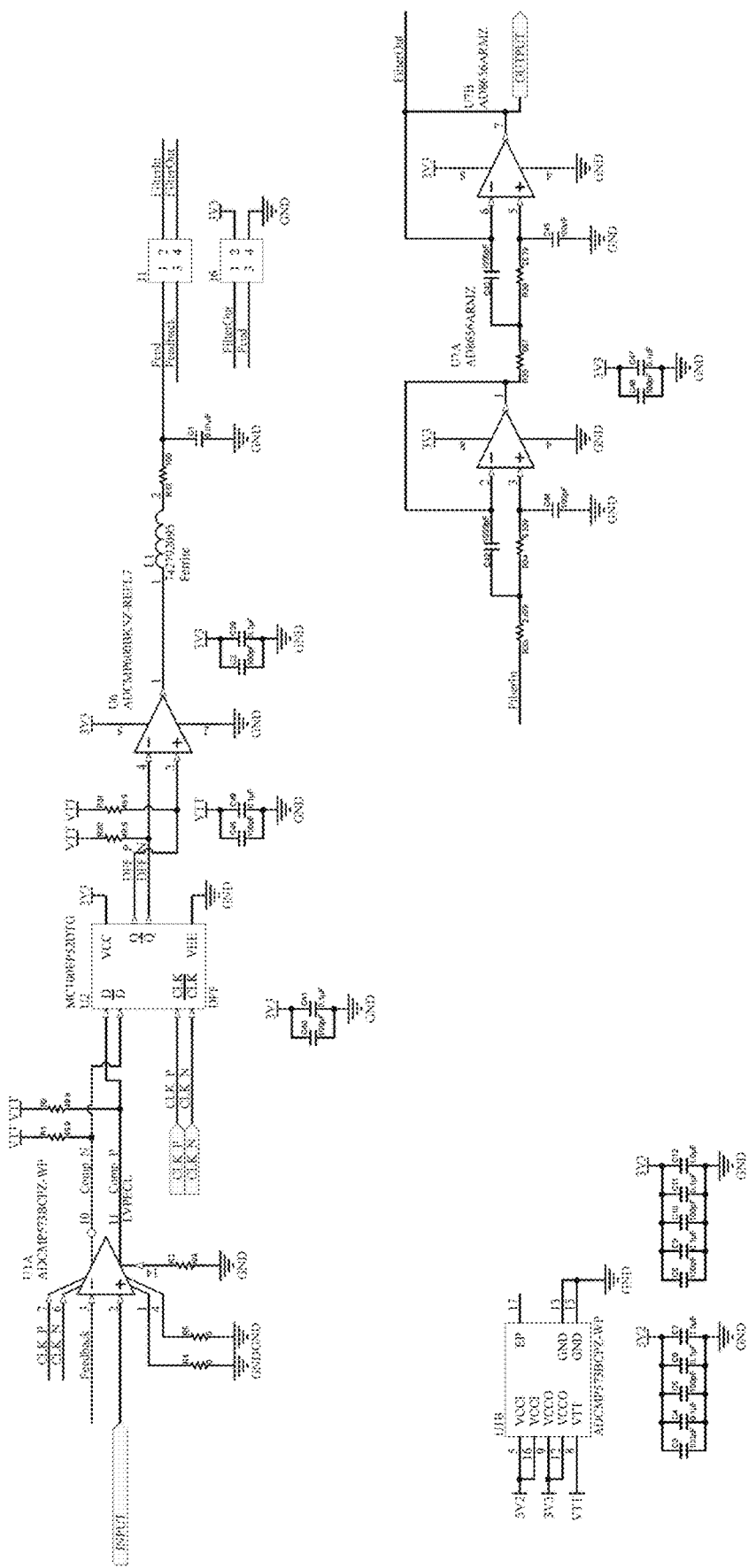
Figure 4:
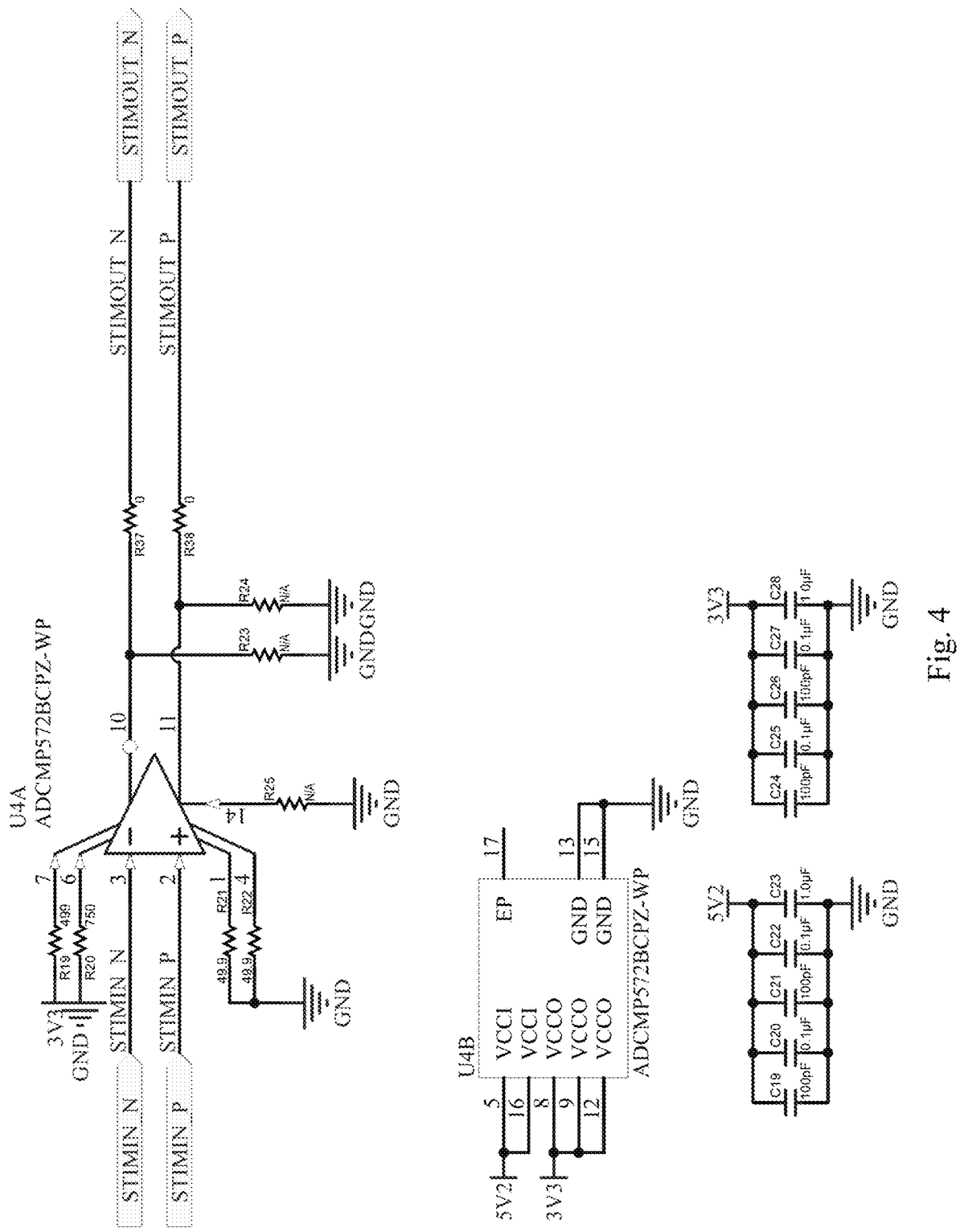
Figure 5:
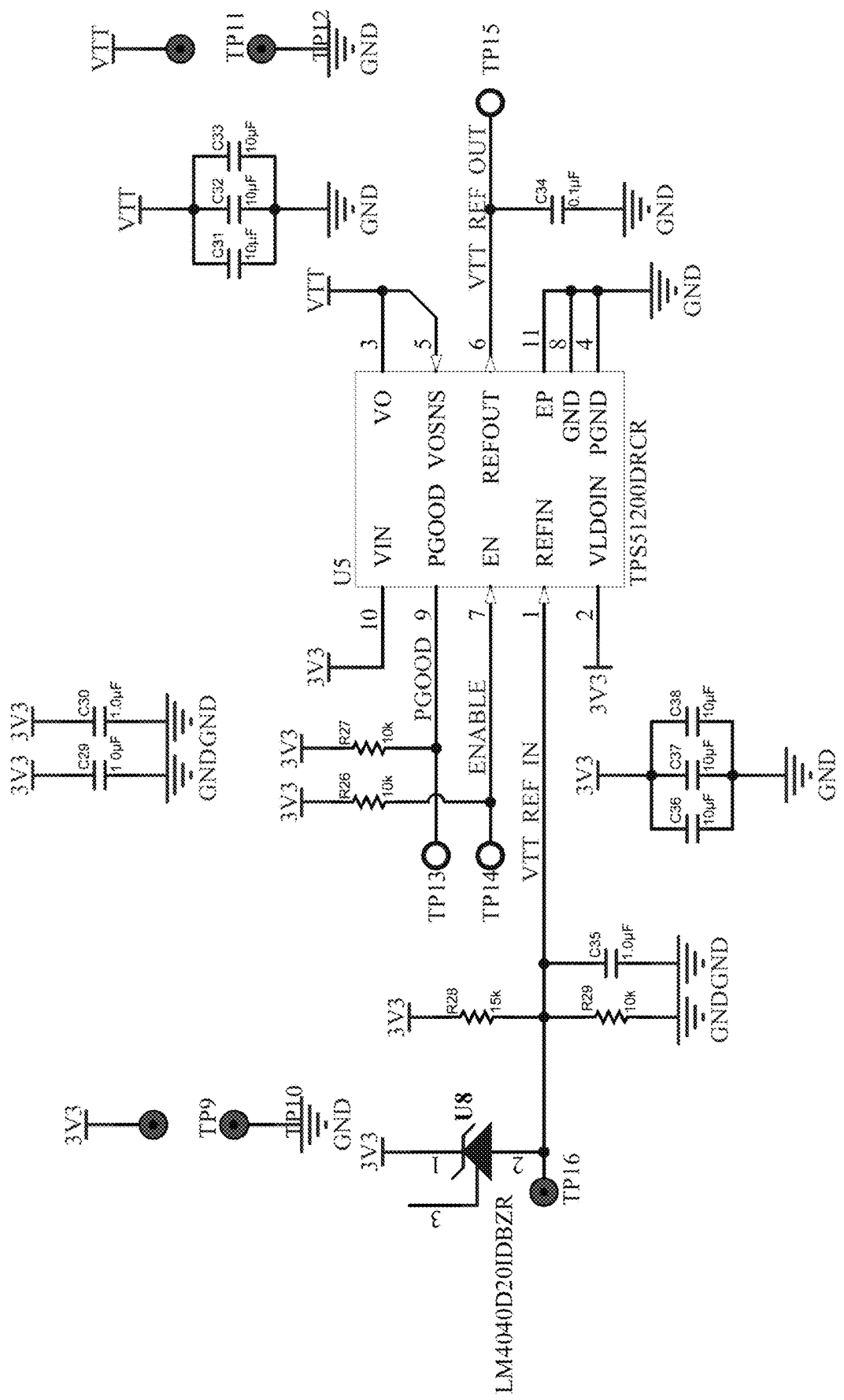
Figure 6:
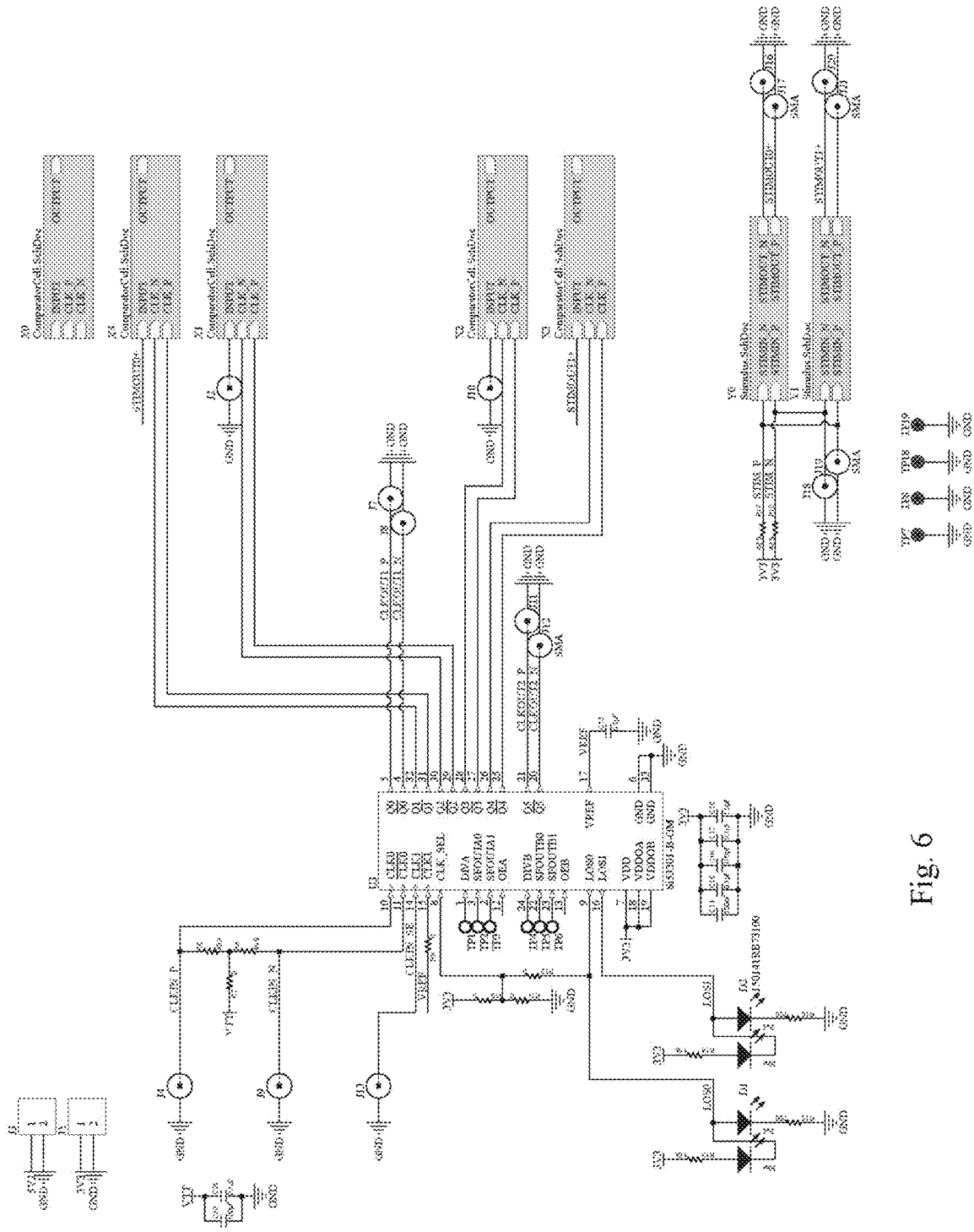

FIGS. 3-6 depict an example hierarchical schematic of an example implementation of the invention, wherein FIG. 3 depicts an example comparator cell, FIG. 4 depicts an example stimulus generator, FIG. 5 depicts an example termination supply, and FIG. 6 depicts an example top layer view.

Figure 7:
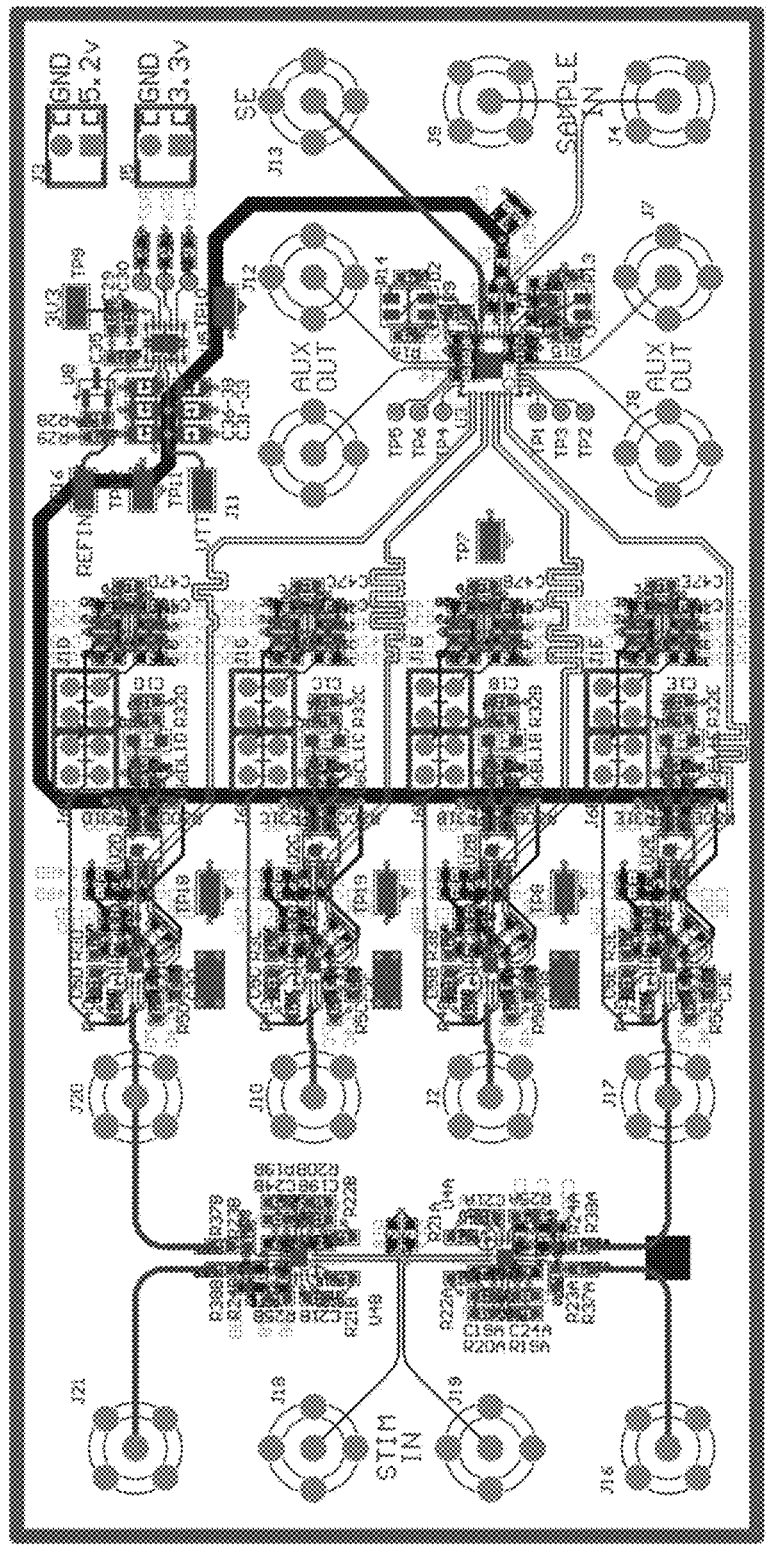
FIG. 7 depicts a layout view of an example embodiment of the invention.

FIG. 7 depicts a layout single view for an example embodiment of the invention.

Figure 8A:
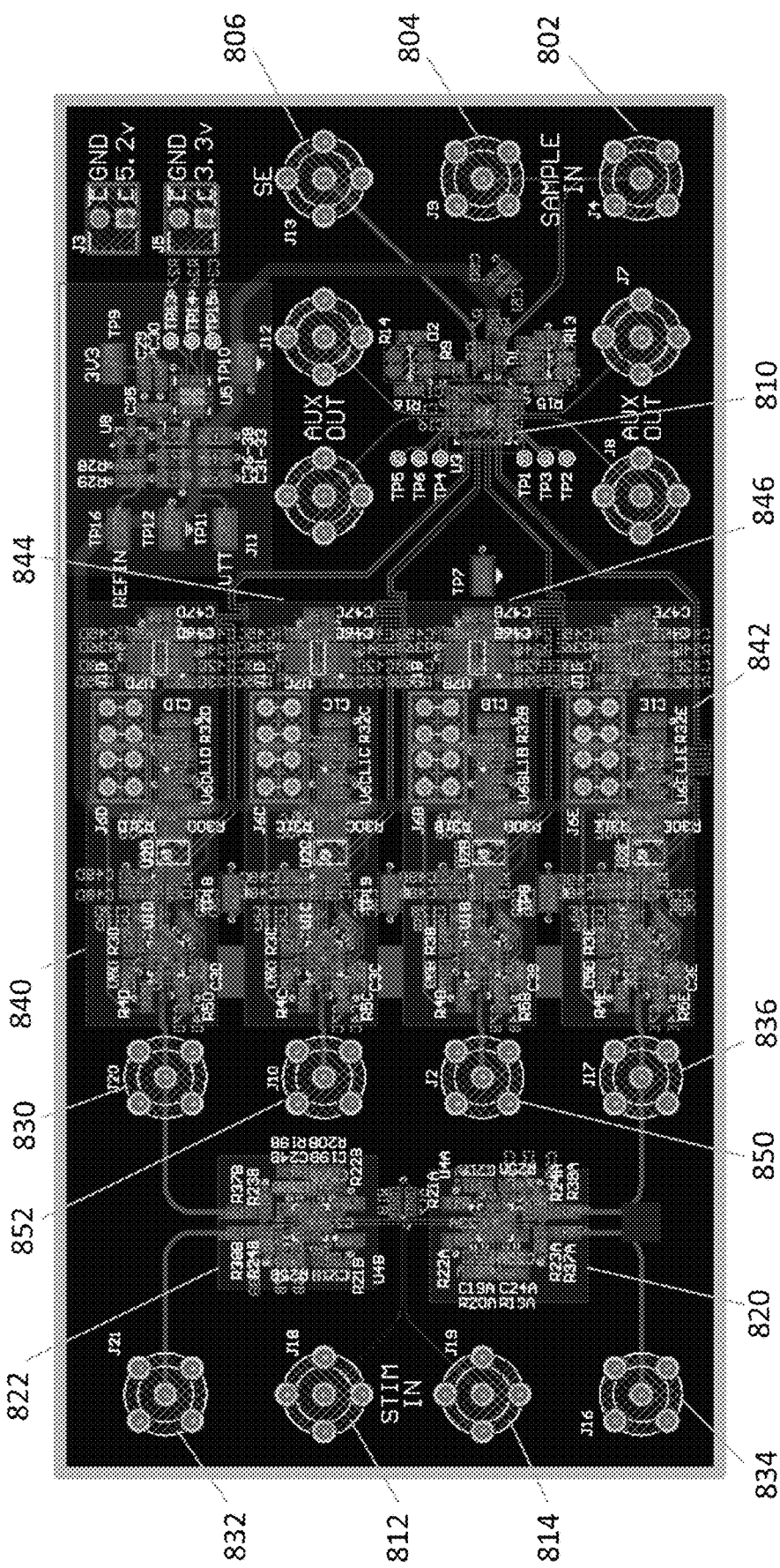
FIGS. 8A and 8B depict an annotated hierarchical layout view used to describe an example of the operation of an example embodiment of the invention.
Figure 8B:
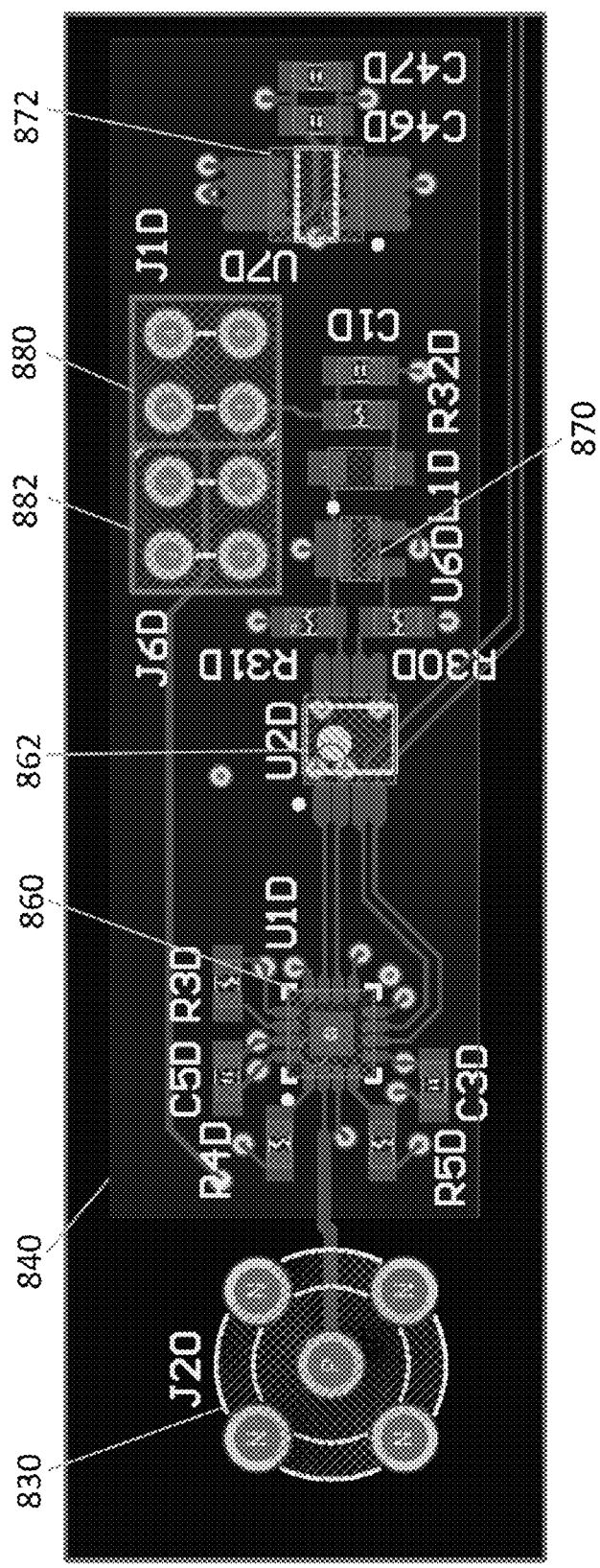

FIG. 8A depicts an annotated hierarchical layout view used to describe an example of the operation of an example embodiment of the invention, with FIG. 8B presenting a detailed view of one of the capture cells shown in FIG. 8A. As shown in FIGS. 8A-B, the sample clock enters the system on the right hand side differentially through connectors 802, 804 (J4, J9), or single ended through connector 806 (J13). It is buffered and distributed by 810 (U3), a Silicon Graphics Si53301-B-GM low jitter clock buffer. The stimulus clock enters the system on the left hand side differentially through connectors 812, 814 (J18, J19). It is fed to two stimulus generators, each of which is composed of an Analog Devices ADCMP572 high speed comparator 820, 822 (U4A, U4B) and supporting passive components. The differential stimulus is output on connector pairs 830, 832, 834, 836 (J20, J21 and J16, J17), which in turn connect to the device(s)-under-test. One 830, 836 of each pair is additionally connected to a capture (sampler) cell 840, 842. The responses of the device(s)-under-test enter on connectors 850, 852 (J2, J10). These signals are passed to the two remaining capture cells 844, 846.

The four capture cells 840, 842, 844, 846, one of which 840 is shown in detail in FIG. 8B, are vertically arrayed in the center of FIG. 8A. Example capture cell 840 (FIG. 8B) takes a high frequency signal (stimulus or response) on its input 830, which feeds into Analog Devices ADCMP573 high speed comparator 860 (U1D). Its output is sent to an OnSemiconductor MC100EP52DTG high speed D flip-flop 862 (U2D). The sample clock controls timing for both the latch of comparator 860 and D flip-flop 862. The output of D flip-flop 862 is buffered and low pass filtered by comparator 870 (U6D), operational amplifier 872 (U7D), and associated passive components. The buffered and filtered response feeds back to the inverting input of high speed comparator 860 (U1D), and is additionally used as an output of the system. The four outputs of capture cells 840, 842, 844, 846 are digitized and processed by traditional means off-board through connectors 880, 882 (J1D, J6D).

An advantage of the invention lies in the ability to economically and easily scale up to a high number of channels. Multiple devices may be simultaneously tested by employing multiple instantiations of the invention, with all instantiations under the control of a single timing system. It is further possible, and sometimes desirable, to have multiple capture cells attached to the output(s) of the device- or devices-under-test, and/or multiple stimulus generators attached to the input(s).

Similarly, it is possible, and sometimes desirable, to include capture cells at the input(s) of the device(s)-under-test. These input capture cells may share the related time bases with the associated output capture cell(s).

In a preferred embodiment, the only RF-compatible parts in the entire system are the sampling comparator and the stimulus generator. All other components are running at 100 MHz or less. Examples of suitable stimulus generators include, but are not limited to, a high slew rate digital output or an RF comb generator.

It will be clear to one of skill in the art that additional components may be used in conjunction with any specific implementation of the invention in order to provide additional features and capabilities. For example, analog-to-digital converters may be used at the output of the capture cells, and one or more microcontrollers may optionally be included at the output of the analog-to-digital converters. In addition, the feedback loop may optionally be broken for increased temporal resolution of purely digital events, such as, for example, but not limited to, LIDAR.

Among the advantages of the invention is that it does not use a traditional sample and hold, which is an extremely expensive and difficult component at these speeds. Going to high channel count is therefore relatively inexpensive. The invention runs independently of the microcontroller after configuration, so there are no timing requirements between this and downstream. It is inherently immune to propagation delays, being only sensitive to jitter. In addition, absolute accuracy of sample/stimulus clocks is actually irrelevant, as only the ratio matters.

While preferred embodiments of the invention are disclosed herein, many other implementations will occur to one of ordinary skill in the art and are all within the scope of the invention. Each of the various embodiments described above may be combined with other described embodiments in order to provide multiple features. Furthermore, while the foregoing describes a number of separate embodiments of the apparatus and method of the present invention, what has been described herein is merely illustrative of the application of the principles of the present invention. Other arrangements, methods, modifications, and substitutions by one of ordinary skill in the art are therefore also considered to be within the scope of the present invention.

What is claimed is:

1. An equivalent time network analyzer, comprising:
   a timing system configured to produce a first time basis and a second time basis that differ in period by less than one part per million, resulting in a linearly varying phase difference between the first time basis and the second time basis;
   at least one high frequency stimulus generator configured to receive timing input according the first time basis and create a periodic waveform that is synchronized to the first time basis and that contains energy at the harmonics of the first time basis that are of interest for measurement, the stimulus generator being connected to an input of a device-under-test so as to be able to stimulate the device-under-test; and
   at least one output capture cell connected to an output of the device-under-test so as to be able to capture an electrical response of the device-under-test to a stimulus from the stimulus generator, each capture cell comprising:
      a high bandwidth input comparator configured to process the electrical response and produce a result;
      a clocked memory element configured to hold the result received from the high bandwidth input comparator according to the second time basis; and
      a low bandwidth feedback filter configured to convert the result from the high bandwidth comparator to a lower frequency analog signal and provide a low frequency analog estimate of a time domain response of the device-under-test as feedback to the input comparator and as an output from the output capture cell.

2. The equivalent time network analyzer of claim 1, wherein the timing system comprises a first clock that produces the first time base and a second clock that produces the second time base, the output of the first clock is connected to the stimulus generator, and the output of the second clock is connected to the clocked memory element.

3. The equivalent time network analyzer of claim 1, wherein the high frequency stimulus generator is a high slew rate digital output, a step recovery diode, or an RF comb generator.

4. The equivalent time network analyzer of claim 1, wherein the clocked memory element is a high speed latch or D flip-flop.

5. The equivalent time network analyzer of claim 1, wherein there is at least one input capture cell, the input capture cell being attached to the input of the device-under-test and sharing the second time basis with the output capture cells.

6. The equivalent time network analyzer of claim 1, wherein there are a plurality of stimulus generators that share the first time basis.

7. The equivalent time network analyzer of claim 1, wherein there are a plurality of capture cells that share the second time basis.

8. The equivalent time network analyzer of claim 1, wherein there are a plurality of stimulus generators that share the first time basis and a plurality of capture cells that share the second time basis.

9. The equivalent time network analyzer of claim 1, further comprising at least one analog-to-digital converter, each analog-to digital converter being connected at the output of one of the capture cells.

10. The equivalent time network analyzer of claim 9, further comprising at least one microcontroller at the output of at least one of the analog-to-digital converters.

11. The equivalent time network analyzer of claim 1, wherein the analyzer is configured to simultaneously test a plurality of devices-under-test.

12. A method for obtaining the frequency response of a device-under-test using equivalent time over-sampling, comprising:
   producing a first time basis and a second time basis that differ in period by less than one part per million, resulting in a linearly varying phase difference between the first time basis and the second time basis, such that the difference in period is the effective equivalent sampling period of the system and the ratio of the equivalent sampling rate to the true sampling rate is the time dilation factor of the system;
   creating a periodic waveform that is synchronized to the first time basis and contains energy at the harmonics of the first time basis that are of interest for measurement;
   stimulating the device-under-test with the periodic waveform;
   capturing the electrical response of the device-under-test to stimulation by the periodic waveform with at least one capture cell comprising a high bandwidth comparator and a clocked memory element synchronized to the second time basis;
   converting the comparator's high frequency single bit signal to a lower frequency analog signal that is a low frequency analog estimate of a time domain response of the device-under-test;
   feeding the low frequency analog signal back to the comparator as a negative feedback loop; and
   outputting the low frequency analog signal as the analog estimate of the time domain response of the device-under-test.

13. The method of claim 12, further comprising the step of converting the analog estimate of the time domain response of the device-under-test to a frequency domain response.

14. The method of claim 12, further comprising the step of performing further analysis on the analog estimate of the time domain response of the device-under-test.

15. The method of claim 12, further comprising the step of digitizing the low frequency analog signal.

16. The method of claim 15, further comprising the step of performing further analysis on the digitized low frequency analog signal.

17. The method of claim 12, further comprising the step of breaking the feedback loop for increased temporal resolution of digital events.

18. The method of claim 12, further comprising the step of capturing the input to the device-under-test with at least one input capture cell.

* * * * *